United States Patent
Wang

(10) Patent No.: US 8,212,762 B2
(45) Date of Patent: Jul. 3, 2012

(54) OUTPUT AMPLIFIER OF A SOURCE DRIVER WITH AN AMPLIFIER CIRCUIT HAVING AN INVERTED AND NON-INVERTED OUTPUT

(75) Inventor: Chen-Yu Wang, Sinshih Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 472 days.

(21) Appl. No.: 12/577,915

(22) Filed: Oct. 13, 2009

(65) Prior Publication Data
US 2011/0084761 A1 Apr. 14, 2011

(51) Int. Cl.
*G09G 3/36* (2006.01)
(52) U.S. Cl. ........................................ 345/100
(58) Field of Classification Search .................. 345/100;
257/159; 307/417, 418; 315/403
See application file for complete search history.

(56) References Cited

U.S. PATENT DOCUMENTS

| | | | |
|---|---|---|---|
| 7,397,287 B2 * | 7/2008 | Makihara | 327/91 |
| 2005/0264548 A1 * | 12/2005 | Okamura et al. | 345/204 |
| 2009/0096505 A1 * | 4/2009 | Wolters et al. | 327/518 |
| 2009/0244056 A1 * | 10/2009 | Tsuchi | 345/214 |

* cited by examiner

*Primary Examiner* — Chanh Nguyen
*Assistant Examiner* — Jonathan Blancha
(74) *Attorney, Agent, or Firm* — Thomas, Kayden, Horstemeyer & Risley, LLP

(57) ABSTRACT

An output amplifier includes an amplifier circuit, a driving stage circuit, an output stage circuit, a first unity gain buffer, and a second unity gain buffer. The amplifier circuit provides an inverted signal and a non-inverted signal, in which the amplifier circuit amplifies an input pixel signal to generate the inverted signal and the non-inverted signal. The output stage circuit passes a supply voltage or a ground voltage to the pixel circuit according to the inverted signal and the non-inverted signal. The driving stage circuit passes the supply voltage or the ground voltage to the pixel circuit. The first unity gain buffer enhances and passes the inverted signal from the amplifier circuit to the driving stage circuit. The second unity gain buffer passes and enhances the non-inverted signal from the amplifier circuit to the driving stage circuit.

20 Claims, 3 Drawing Sheets

OUTPUT AMPLIFIER OF A SOURCE DRIVER WITH AN AMPLIFIER CIRCUIT HAVING AN INVERTED AND NON-INVERTED OUTPUT

BACKGROUND

1. Field of Invention

The disclosure relates to an output amplifier. More particularly, the disclosure relates to an output amplifier of a source driver.

2. Description of Related Art

In an electronic circuit, an output amplifier transmits signals to a terminal and to drive the next stage of the circuit. For example, in a liquid crystal display, a source driver employs an output amplifier to apply a voltage required for the display panel. The output amplifier, therefore, is an essential device in the source driver.

As the size and the frame rate of the display panel increases, the output amplifier, including a previous stage and an output stage, needs to react more quickly, and also needs to reduce the power consumption. For example, when the frame rate increases, the output buffer of the source driver needs to charge the pixel voltage to a target value within a short time, hence the transistor size of the output amplifier needs to be increased, and the static current or leakage current becomes large as a result.

In addition, because the transistor size of the output amplifier is increased, the loading seen by the stage prior to the output amplifier is increased accordingly, and the stage prior to the output amplifier cannot drive the output amplifier effectively, which reduces the operation speed of the whole source driver.

For the forgoing reasons, there is a need for a new output amplifier to reduce the static current and to improve the operation speed thereof.

SUMMARY

According to one embodiment of the present invention, the output amplifier of a source driver includes an amplifier circuit, an output stage circuit, a driving stage circuit, a first unity gain buffer and a second unity gain buffer. The amplifier circuit includes an inverting terminal for providing an inverted signal, and a non-inverting terminal for providing a non-inverted signal, in which the amplifier circuit amplifies an input pixel signal to generate the inverted signal and the non-inverted signal. The output stage circuit includes a first output terminal for passing a supply voltage or a ground voltage to the pixel circuit according to the inverted signal and the non-inverted signal.

The driving stage circuit includes a second output terminal to drive the pixel circuit, in which the driving stage circuit passes the supply voltage or the ground voltage to the pixel circuit. The first unity gain buffer is electrically connected to the driving stage circuit and enhances and passes the inverted signal from the amplifier circuit to the driving stage circuit. The second unity gain buffer is electrically connected to the driving stage circuit and both passes and enhances the non-inverted signal from the amplifier circuit to the driving stage circuit. The first unity gain buffer and the second unity gain buffer both enhance the driving ability to drive the driving stage circuit.

According to another embodiment of the present invention, the output amplifier of a source driver includes an amplifier circuit, an output stage circuit, a driving stage circuit, a high impedance control switch, a first unity gain buffer, and a second unity gain buffer. The amplifier circuit includes an inverting terminal for providing an inverted signal, and a non-inverting terminal for providing a non-inverted signal, in which the amplifier circuit amplifies an input pixel signal to generate the inverted signal and the non-inverted signal.

The output stage circuit includes a first output terminal for passing a supply voltage or a ground voltage to the pixel circuit according to the inverted signal and the non-inverted signal. The driving stage circuit includes a second output terminal to drive the pixel circuit, in which the driving stage circuit passes the supply voltage or the ground voltage to the pixel circuit. The high impedance control switch, electrically connected between the first output terminal and the second output terminal, passes or blocks the input pixel signal according to a high impedance signal, in which the high impedance signal represents the period where the pixel circuit is in a high impendence state.

The first unity gain buffer, electrically connected to the driving stage circuit, passes the inverted signal generated by the amplifier circuit to the driving stage circuit. The second unity gain buffer, electrically connected to the driving stage circuit, passes the non-inverted signal generated by the amplifier circuit to the driving stage circuit, in which the first unity gain buffer and the second unity gain buffer both enhance the driving ability to drive the driving stage circuit.

It is to be understood that both the foregoing general description and the following detailed description are by examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1:
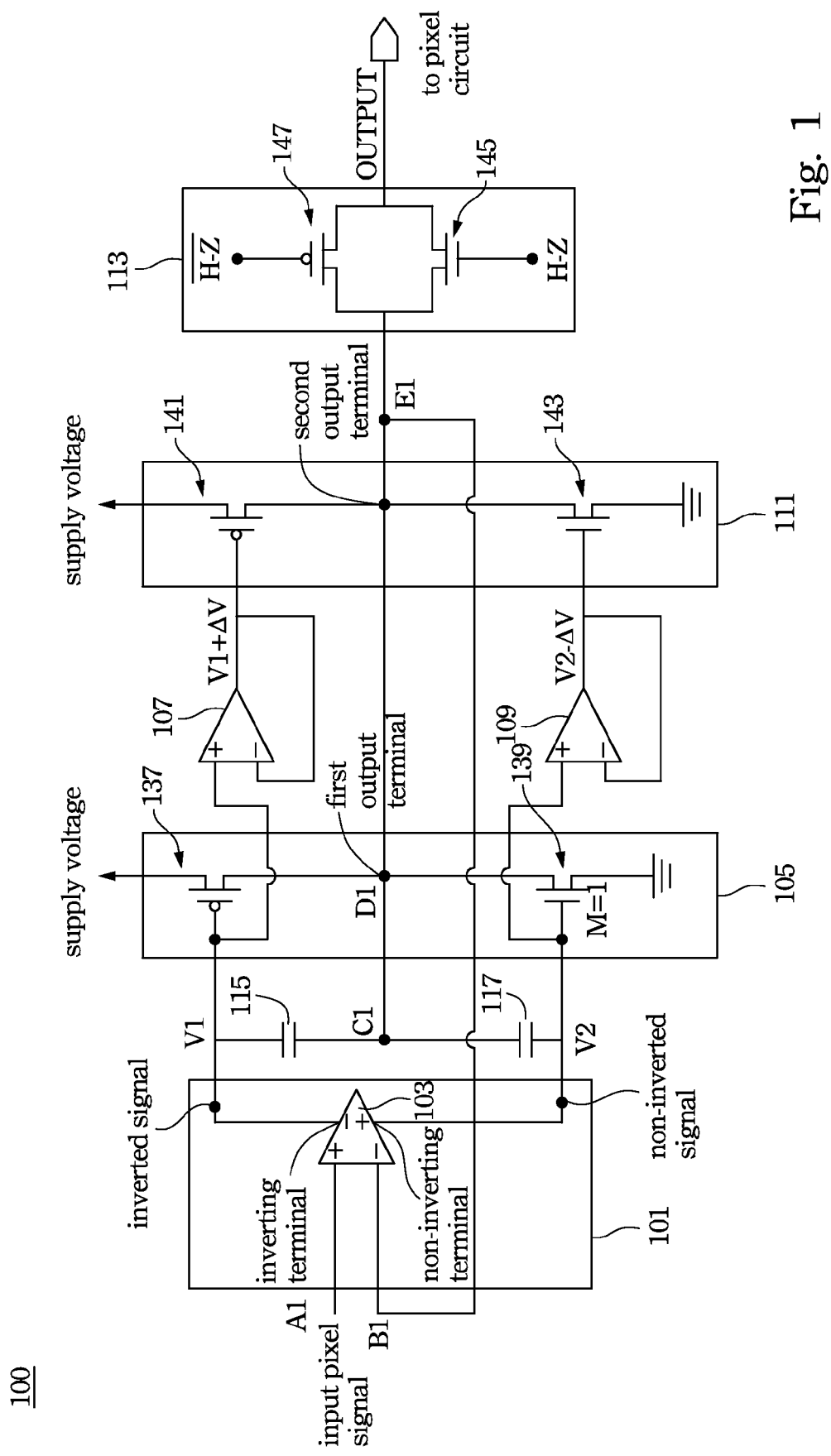
FIG. 1 shows the output amplifier of a source driver driving a pixel circuit of a display panel according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The following embodiments recite an output amplifier of a source driver, in which the output amplifier can reduce the static current and improve the operation speed thereof.

FIG. 1 shows the output amplifier of a source driver driving a pixel circuit of a display panel according to one embodiment of the present invention. The output amplifier 100 includes an amplifier circuit 101, an output stage circuit 105, a driving stage circuit 111, a first unity gain buffer 107, and a second unity gain buffer 109.

The amplifier circuit 101, used for amplifying the input pixel signal to generate the inverted signal and the non-inverted signal, includes an inverting terminal (−) for providing the inverted signal, and a non-inverting terminal (+) for providing the non-inverted signal. The amplifier circuit 101, such as an operation amplifier 103, further includes a negative input terminal (−, B1) electrically connected to the first output terminal D1 and the second output terminal E1, such that the voltages on the negative input terminal B1, the first output terminal D1 and the second output terminal E1 have the same level.

In addition, the first capacitor 115 is electrically connected between the inverting terminal (−) and the negative input terminal B1 of the amplifier circuit 101, for maintaining the voltage drop between the inverting terminal and the negative input terminal, while the second capacitor 117 is electrically connected between the non-inverting terminal (+) and the negative input terminal B1 of the amplifier circuit 101 for maintaining the voltage drop between the non-inverting terminal and the negative input terminal B1.

The output stage circuit 105 includes an eleventh transistor 137 and a twelfth transistor 139, in which the output stage circuit 105 has a first output terminal D1 for passing a supply voltage or a ground voltage to the pixel circuit according to the inverted signal and the non-inverted signal.

In the output stage circuit 105, the eleventh transistor 137 has a gate electrically connected to the inverting terminal of the amplifier circuit 101, and also electrically connected to a positive input terminal of the first unity gain buffer 107. The eleventh transistor 137 has a source receiving the supply voltage. The twelfth transistor 139 has a gate electrically connected to the non-inverting terminal (+) of the amplifier circuit 101, and electrically connected to a positive input terminal of the second unity gain buffer 109. The twelfth transistor 139 also has a drain electrically connected to the drain of the eleventh transistor 137, and has a source receiving the ground voltage.

The driving stage circuit 111, also passing the supply voltage or the ground voltage to drive the pixel circuit, has a thirteenth transistor 141, a fourteenth transistor 143, and a second output terminal E1 to drive the pixel circuit. Therefore, the pixel circuit is driven by both the output stage circuit 105 and the driving stage circuit 111. In the driving stage circuit 111, the thirteenth transistor 141 has a gate electrically connected to an output terminal of the first unity gain buffer 107, and has a source receiving the supply voltage. The fourteenth transistor 143 has a gate electrically connected to an output terminal of the second unity gain buffer 109, a drain electrically connected to the drain of the thirteenth transistor 141, and a source receiving the ground voltage.

The first unity gain buffer 107 and the second unity gain buffer 109, electrically connected to the driving stage circuit 111, enhance and pass the inverted signal and the non-inverted signal from the amplifier circuit 101 to the driving stage circuit 111, in order to improve the driving ability to drive the pixel circuit. Because the transistor size of the driving stage circuit 111 is enlarged, so the output amplifier 100 need to add the first unity gain buffer 107 and the second unity gain buffer 109 to drive the driving stage circuit 111 more effectively. Without the first unity gain buffer 107 and the second unity gain buffer 109, the loading seen by the amplifier circuit 101 or the output stage circuit 105 is large due to the large transistor size of the driving stage circuit 111, and amplifier circuit 101 or the output stage circuit 105 drives the driving stage circuit 111 very slowly.

The output amplifier 100 further includes a high impedance control switch 113, electrically connected to the second output terminal E1, passes or blocks the input pixel signal according to a high impedance signal H-Z, in which the high impedance signal H-Z represents the period where the pixel circuit is in a high impendence state. For example, if the high impedance signal H-Z is logic 1, the high impedance control switch 113 is turned off and is not conductive, then the pixel circuit is blocked, which means that the pixel circuit input terminal cannot receive signal from the output amplifier 100, and is in high impedance state.

The high impedance control switch 113 includes a fifteenth transistor 145 and a sixteenth transistor 147. The fifteenth transistor 145 has a drain electrically connected to the second output terminal E1 of the driving stage circuit 111, and has a source electrically connected to the OUTPUT for the pixel circuit. The sixteenth transistor 147 has a source electrically connected to the first output terminal D1 of the output stage circuit 105, and has a drain electrically connected to the OUTPUT for the pixel circuit.

Figure 2:
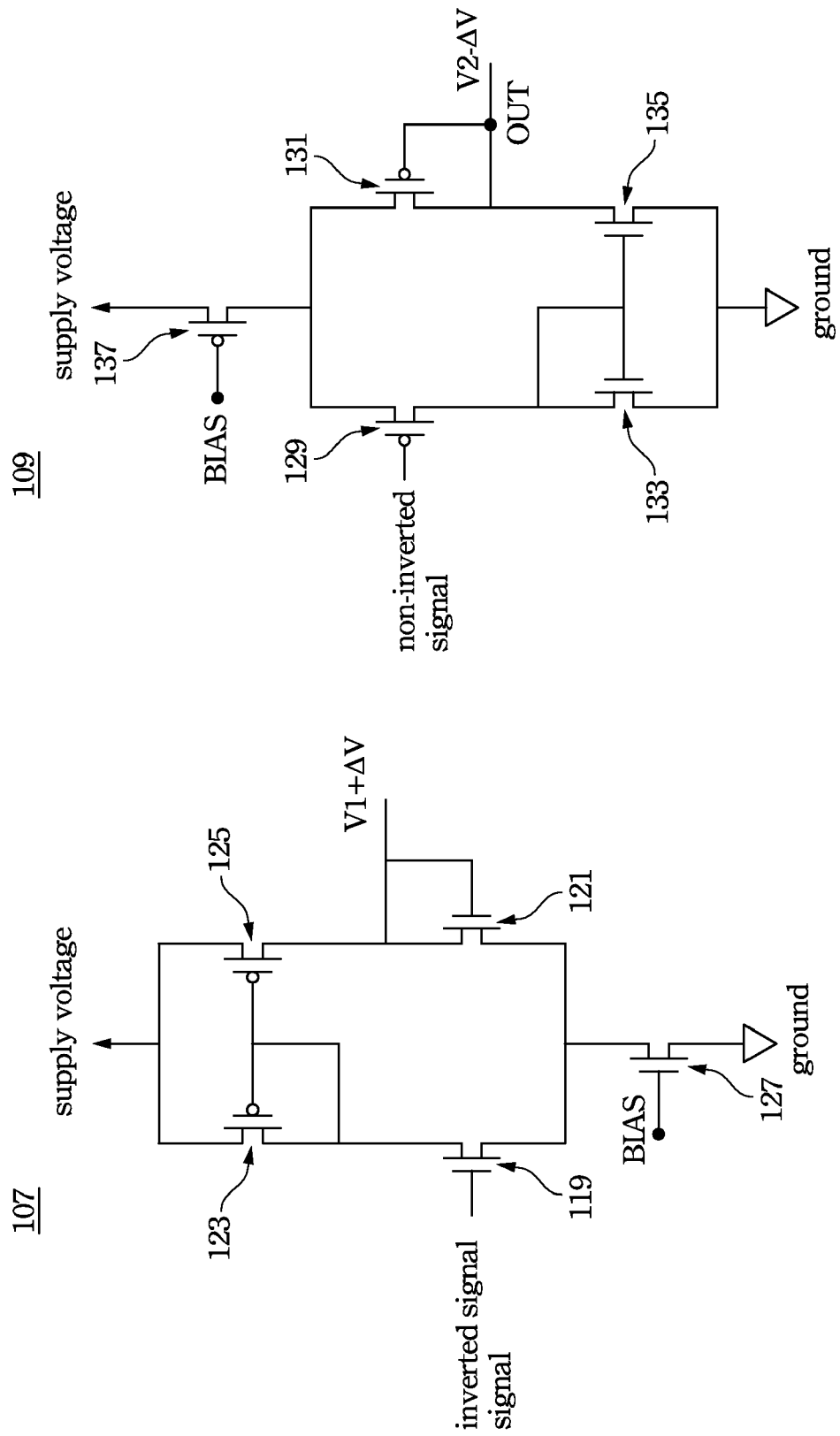
FIG. 2 shows the circuit diagram of the first unity gain buffer and the second unity gain buffer according to one embodiment of the present invention.

FIG. 2 shows the circuit diagram of the first unity gain buffer and the second unity gain buffer according to one embodiment of the present invention. The first unity gain buffer 107 includes a first transistor 119, a second transistor 121, a third transistor 123, a fourth transistor 125, and a fifth transistor 127, in which these transistors all have gate, source, and drain.

In the first unity gain buffer 107, the gate of the first transistor 119 is electrically connected to the inverting terminal of the amplifier circuit 101 for receiving the inverted signal, the gate of the second transistor 121 is electrically connected to the drain of the second transistor 121, and the drain of the fifth transistor 127 is connected to the sources of the first transistor 119 and the second transistor 121.

In addition, the gate and the drain of the third transistor 123 are electrically connected to the drain of the first transistor 119, and source of the third transistor 123 receives the supply voltage. In the meanwhile, the gate of the fourth transistor 125 is electrically connected to the gate of the third transistor 123, the drain of the fourth transistor 125 is electrically connected to the drain of the second transistor 121, and the source of the fourth transistor 125 receives the supply voltage.

Of those transistors in the first unity gain buffer 107, the size of the first transistor 119 is greater than the size of the second transistor 121. Therefore, the resistance and the voltage drop of the first transistors 119 are different from those of the second transistor 121, such that the voltage on the drain of the second transistor 121, represented as V1+$\Delta$V, is greater than the voltage of the inverted signal.

Another aspect, the second unity gain buffer 109 includes a sixth transistor 129, a seventh transistor 131, an eighth transistor 133, and a ninth transistor 135 which all have a gate, a drain and a source. The gate of the sixth transistor 129 is electrically connected to the non-inverting terminal of the amplifier circuit 101 for receiving the non-inverted signal, and the gate of the seventh transistor 131 is electrically connected to the drain of the seventh transistor 131. In addition, the gate and the drain of the eighth transistor 133 are electrically connected to the drain of the sixth transistor 129, the gate of the ninth transistor 135 is electrically connected to the gate of the eighth transistor 133, and the drain of the ninth transistor 135 is electrically connected to the drain of the seventh transistor 131.

In this second unity gain buffer 109, the size of the sixth transistor 129 is greater than the size of the seventh transistor 131, hence the resistances and the voltage drop of the transistors 129 are different from those of the seventh transistor 131, such that the voltage on the drain of the seventh transistor 131, represented as V2−$\Delta$V is less than the voltage of the non-inverted signal received by the gate of the sixth transistor 129.

Because the voltage V1+$\Delta$V, controlling the PMOS transistor 141, is greater than the voltage V2−$\Delta$V controlling the NMOS transistor 143, the PMOS transistor 141 has been turned off deeply and tightly when the NMOS transistor 143 is turned on, so the static current flowing the PMOS transistor 141 and the NMOS transistor 143 is reduced, and the power consumption is thus reduced.

Figure 3:
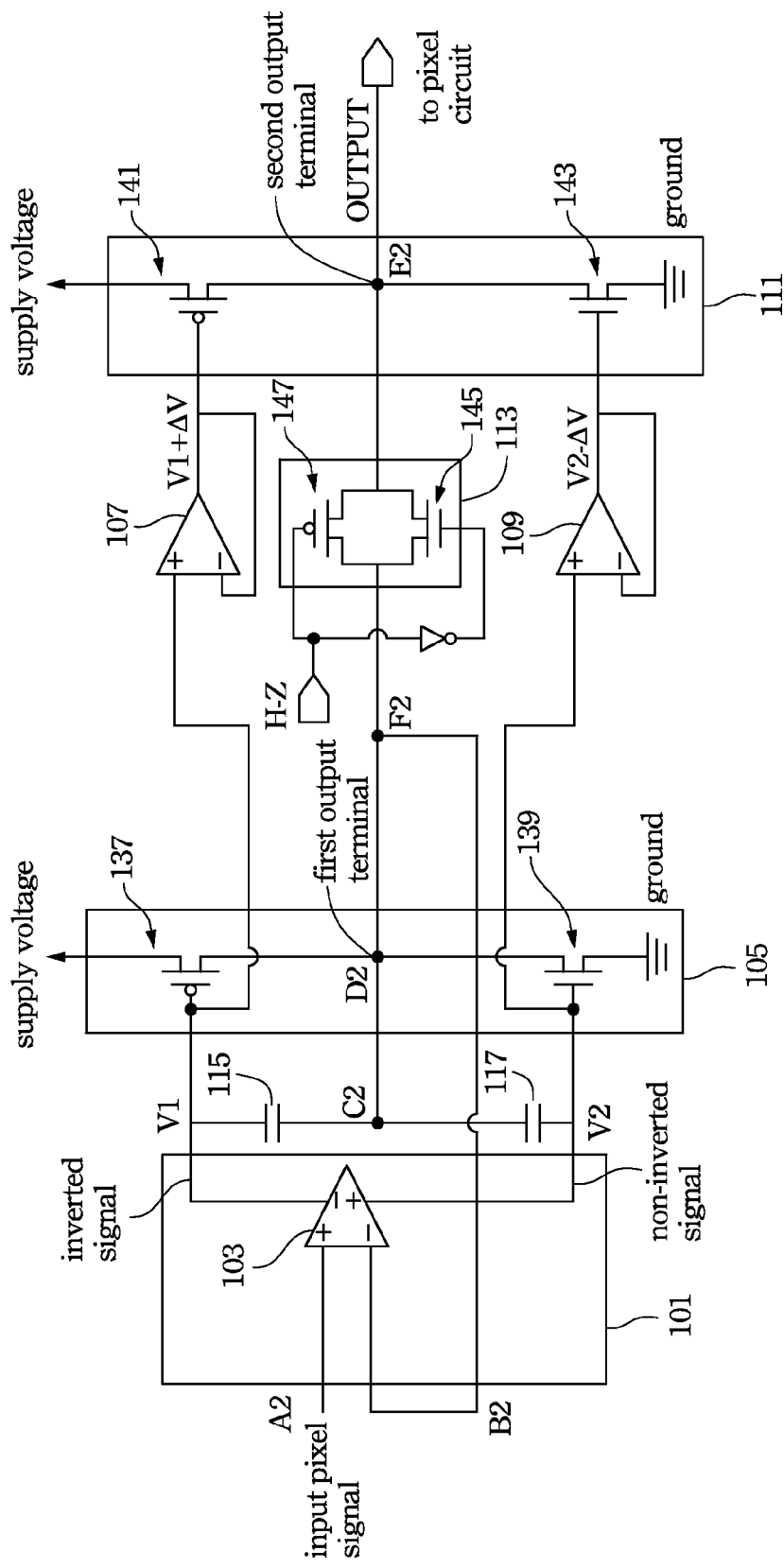
FIG. 3 shows the output amplifier of a source driver driving a pixel circuit of a display panel according to another embodiment of the present invention.

FIG. 3 shows the output amplifier of a source driver driving a pixel circuit of a display panel according to another embodiment of the present invention. In this embodiment, the output amplifier 300 includes an amplifier circuit 101, an output stage circuit 105, a driving stage circuit 111, a first unity gain buffer 107, and a second unity gain buffer 109, which operate and arrange similarly to those elements recited in FIG. 1, except an additional high impedance control switch 113.

The high impedance control switch 113, electrically connected between the first output terminal D2 and the second output terminal E2, passes or blocks the input pixel signal according to a high impedance signal H-Z, in which the high impedance signal H-Z represents the period where the pixel circuit is in a high impendence state. Because the high impedance control switch 113 is moved prior to the driving stage circuit 111, so the loading seen by the driving stage circuit 111 is reduced, and the driving ability of the driving stage circuit 111 to drive the pixel circuit is thus improved.

According to the above embodiments, the output amplifier of the source driver can drive (rise up or fall) the pixel voltage signal to a target value more quickly, and the operation speed of the output amplifier is improved. In addition, because the PMOS and the NMOS in the driving stage circuit of the output amplifier are controlled by voltages with different level, the static current flowing through the PMOS and the NMOS in the driving stage circuit is reduced, and the power consumption is reduced as a result.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. An output amplifier of a source driver driving a pixel circuit of a panel, the output amplifier comprising:
  an amplifier circuit comprising an inverting terminal for providing a inverted signal, and a non-inverting terminal for providing a non-inverted signal, wherein the amplifier circuit amplifies an input pixel signal to generate the inverted signal and the non-inverted signal;
  an output stage circuit comprising a first output terminal for passing a supply voltage or a ground voltage to the pixel circuit according to the inverted signal and the non-inverted signal;
  a driving stage circuit comprising a second output terminal to drive the pixel circuit, wherein the driving stage circuit passes the supply voltage or the ground voltage to the pixel circuit;
  a first unity gain buffer, electrically connected to the driving stage circuit, for enhancing and passing the inverted signal from the amplifier circuit to the driving stage circuit; and
  a second unity gain buffer, electrically connected to the driving stage circuit, for passing and enhancing the non-inverted signal from the amplifier circuit to the driving stage circuit.

2. The output amplifier of a source driver as claimed in claim 1, further comprising a high impedance control switch, electrically connected to the second output terminal, passing or blocking the input pixel signal according to a high impedance signal, wherein the high impedance signal represents the period where the pixel circuit is in a high impendence state.

3. The output amplifier of a source driver as claimed in claim 1, wherein the first unity gain buffer comprises:
  a first transistor comprising a gate and a drain, wherein the gate of the first transistor is electrically connected to the inverting terminal of the amplifier circuit for receiving the inverted signal;
  a second transistor comprising a gate, and a drain, wherein the gate of the second transistor is electrically connected to the drain of the second transistor;
  a third transistor comprising a gate, a drain, and a source, wherein the gate and the drain of the third transistor are electrically connected to the drain of the first transistor, and the source of the third transistor receives the supply voltage; and
  a fourth transistor comprising a gate, a drain, and a source, wherein the gate of the fourth transistor is electrically connected to the gate of the third transistor, the drain of the fourth transistor is electrically connected to the drain of the second transistor, and the source of the fourth transistor receives the supply voltage.

4. The output amplifier of a source driver as claimed in claim 3, wherein the size of the first transistor is greater than the size of the second transistor, such that the voltage on the drain of the second transistor is greater than the voltage of the inverted signal.

5. The output amplifier of a source driver as claimed in claim 1, wherein the second unity gain buffer comprises:
  a sixth transistor comprising a gate and a drain, wherein the gate of the sixth transistor is electrically connected to the non-inverting terminal of the amplifier circuit for receiving the non-inverted signal;
  a seventh transistor comprising a gate, and a drain, wherein the gate of the seventh transistor is electrically connected to the drain of the seventh transistor;
  an eighth transistor comprising a gate, a source, and a drain, wherein the gate and the drain of the eighth transistor are electrically connected to the drain of the sixth transistor, and the source of the eighth transistor receives the ground voltage; and
  a ninth transistor comprising a gate, a source, and a drain, wherein the gate of the ninth transistor is electrically connected to the gate of the eighth transistor, the drain of the ninth transistor is electrically connected to the drain of the seventh transistor, and the source of the ninth transistor receives the ground voltage.

6. The output amplifier of a source driver as claimed in claim 5, wherein the size of the sixth transistor is greater than the size of the seventh transistor, such that the voltage on the drain of the seventh transistor is less than the voltage of the non-inverted signal.

7. The output amplifier of a source driver as claimed in claim 1, wherein the amplifier circuit further comprises a negative input terminal electrically connected to the first output terminal and the second output terminal, such that the voltages on the negative input terminal, the first output terminal and the second output terminal have the same level.

8. The output amplifier of a source driver as claimed in claim 1, wherein the output stage circuit further comprises:
  an eleventh transistor having a gate electrically connected to the inverting terminal of the amplifier circuit and electrically connected to a positive input terminal of the first unity gain buffer, and having a source receiving the supply voltage; and
  a twelfth transistor having a gate electrically connected to the non-inverting terminal of the amplifier circuit and electrically connected to an positive input terminal of the second unity gain buffer, having a drain electrically connected to drain of the eleventh transistor, and having a source receiving the ground voltage.

9. The output amplifier of a source driver as claimed in claim 1, wherein the driving stage circuit further comprises:
a thirteenth transistor having a gate electrically connected to an output terminal of the first unity gain buffer, and having a source receiving the supply voltage; and
a fourteenth transistor having a gate electrically connected to an output terminal of the second unity gain buffer, having a drain electrically connected to the drain of the thirteenth transistor, and having a source receiving the ground voltage.

10. The output amplifier of a source driver as claimed in claim 1, further comprising:
a first capacitor, electrically connected between the inverting terminal and a negative input terminal of the amplifier circuit, for maintaining the voltage drop between the inverting terminal and the negative input terminal; and
a second capacitor, electrically connected between the non-inverting terminal and the negative input terminal of the amplifier circuit, for maintaining the voltage drop between the non-inverting terminal and the negative input terminal.

11. An output amplifier of a source driver driving a pixel circuit of a panel, the output amplifier comprising:
an amplifier circuit comprising an inverting terminal for providing a inverted signal, and an non-inverting terminal for providing a non-inverted signal, wherein the amplifier circuit amplifies an input pixel signal to generate the inverted signal and the non-inverted signal;
an output stage circuit comprising a first output terminal for passing a supply voltage or a ground voltage to the pixel circuit according to the inverted signal and the non-inverted signal;
a driving stage circuit comprising a second output terminal to drive the pixel circuit, wherein the driving stage circuit passes the supply voltage or the ground voltage to the pixel circuit;
a high impedance control switch, electrically connected between the first output terminal and the second output terminal, passing or blocking the input pixel signal according to a high impedance signal, wherein the high impedance signal represents the period where the pixel circuit is in a high impendence state;
a first unity gain buffer, electrically connected to the driving stage circuit, for passing the inverted signal generated by the amplifier circuit to the driving stage circuit; and
a second unity gain buffer, electrically connected to the driving stage circuit, for passing the non-inverted signal generated by the amplifier circuit to the driving stage circuit,
wherein the first unity gain buffer and the second unity gain buffer enhance the driving ability to drive the driving stage circuit.

12. The output amplifier of a source driver as claimed in claim 11, wherein the high impedance control switch comprises:
a fifteenth transistor having a drain electrically connected to the first output terminal of the output stage circuit, and having a source electrically connected to the second output terminal of driving stage circuit; and
a sixteenth transistor having a source electrically connected to the first output terminal of the output stage circuit, and having a drain electrically connected to the second output terminal of driving stage circuit.

13. The output amplifier of a source driver as claimed in claim 11, wherein the first unity gain buffer comprises:
a first transistor comprising a gate and a drain, wherein the gate of the first transistor is electrically connected to the inverting terminal of the amplifier circuit for receiving the inverted signal;
a second transistor comprising a gate and a drain, wherein the gate of the second transistor is electrically connected to the drain of the second transistor;
a third transistor comprising a gate, a drain, and a source, wherein the gate and the drain of the third transistor are electrically connected to the drain of the first transistor, and the source of the third transistor receives the supply voltage; and
a fourth transistor comprising a gate, a drain, and a source, wherein the gate of the fourth transistor is electrically connected to the gate of the third transistor, the drain of the fourth transistor is electrically connected to the drain of the second transistor, and the source of the third transistor receives the supply voltage.

14. The output amplifier of a source driver as claimed in claim 13, wherein the size of the first transistor is greater than the size of the second transistor, such that the voltage on the drain of the second transistor is greater than the voltage of the inverted signal.

15. The output amplifier of a source driver as claimed in claim 11, wherein the second unity gain buffer comprises:
a sixth transistor comprising a gate, and a drain, wherein the gate of the sixth transistor is electrically connected to the non-inverting terminal of the amplifier circuit for receiving the non-inverted signal;
a seventh transistor comprising a gate and a drain, wherein the gate of the seventh transistor is electrically connected to the drain of the seventh transistor;
an eighth transistor comprising a gate, a drain, and a source, wherein the gate and the drain of the eighth transistor are electrically connected to the drain of the sixth transistor, and the source of the eighth transistor receives the ground voltage; and
a ninth transistor comprising a gate, a drain, and a source, wherein the gate of the ninth transistor is electrically connected to the gate of the eighth transistor, the drain of the ninth transistor is electrically connected to the drain of the seventh transistor, and the source of the eighth transistor receives the ground voltage.

16. The output amplifier of a source driver as claimed in claim 15, wherein the size of the sixth transistor is greater than the size of the seventh transistor, such that the voltage on the drain of the seventh transistor is less than the voltage of the non-inverted signal.

17. The output amplifier of a source driver as claimed in claim 11, wherein the amplifier circuit further comprises a negative input terminal tied to the first output terminal and the second output terminal, whereby the voltage levels on the negative input terminal, the first output terminal and the second output terminal are the same.

18. The output amplifier of a source driver as claimed in claim 11, wherein the output stage circuit further comprises:
a eleventh transistor having a gate electrically connected to the inverting terminal of the amplifier circuit and electrically connected to a positive input terminal of the first unity gain buffer, and having a source receiving the supply voltage; and
a twelfth transistor having a gate electrically connected to the non-inverting terminal of the amplifier circuit and electrically connected to an positive input terminal of the second unity gain buffer, having a drain electrically connected to drain of the eleventh transistor, and having a source receiving the ground voltage.

19. The output amplifier of a source driver as claimed in claim 11, wherein the driving stage circuit further comprises:
   a thirteenth transistor having a gate electrically connected to an output terminal of the first unity gain buffer, and having a source receiving the supply voltage; and
   a fourteenth transistor having a gate electrically connected to an output terminal of the second unity gain buffer, having a drain electrically connected to drain of the thirteenth transistor, and having a source receiving the ground voltage.

20. The output amplifier of a source driver as claimed in claim 11, further comprising:
   a first capacitor, electrically connected between the inverting terminal and a negative input terminal of the amplifier circuit, for maintaining the voltage drop between the inverting terminal and the negative input terminal; and
   a second capacitor, electrically connected between the non-inverting terminal and the negative input terminal of the amplifier circuit, for maintaining the voltage drop between the non-inverting terminal and the negative input terminal.

* * * * *